US012609704B2

(12) United States Patent
Naaman et al.

(10) Patent No.: US 12,609,704 B2
(45) Date of Patent: Apr. 21, 2026

(54) QUBIT RESET USING TUNABLE RESONATOR WITH FREQUENCY DEPENDENT LOSS

(71) Applicant: Google LLC, Mountain View, CA (US)

(72) Inventors: Ofer Naaman, Santa Barbara, CA (US); George Earl Grant Sterling, Santa Barbara, CA (US); Kevin Chenghao Miao, Goleta, CA (US); Alexander Matthew Opremcak, Goleta, CA (US)

(73) Assignee: GOOGLE LLC, Mountain View, CA (US)

( * ) Notice: Subject to any disclaimer, the term of this patent is extended or adjusted under 35 U.S.C. 154(b) by 37 days.

(21) Appl. No.: 18/653,196

(22) Filed: May 2, 2024

(65) Prior Publication Data

US 2025/0343550 A1     Nov. 6, 2025

(51) Int. Cl.
*H03K 19/195* (2006.01)
*G06N 10/40* (2022.01)

(52) U.S. Cl.
CPC ........... *H03K 19/195* (2013.01); *G06N 10/40* (2022.01)

(58) Field of Classification Search
CPC .................................................... H03K 19/195
USPC ........................................................ 327/527
See application file for complete search history.

(56) References Cited

U.S. PATENT DOCUMENTS

| | | |
|---|---|---|
| 2019/0089031 A1 | 3/2019 | Tcaciuc et al. |
| 2020/0250569 A1* | 8/2020 | Kelly ........................ H03K 3/38 |
| 2024/0112059 A1 | 4/2024 | Miao et al. |

OTHER PUBLICATIONS

Mikko Mottonen et al, "Quantum-circuit refrigerator for reset of superconducting qubits", https://meetings.aps.org/Meeting/MAR23/Session/M71.11, retrieved on May 2, 2024, American Physical Society March Meeting 2023, Session M71.00011, 2 pages.
Sevriuk et al., "Initial experimental results on a superconducting-qubit reset based on photon-assisted quasiparticle tunneling," Applied Physics Letters, vol. 121, 234002 (2022), 8 pages.
Wang et al., "Electromagnetic Properties of Aluminum-based Bilayers for Kinetic Inductance Detectors", arxiv:2304.00431v1, dated Apr. 2, 2023, 6 pages.

* cited by examiner

*Primary Examiner* — Tomi Skibinski
(74) *Attorney, Agent, or Firm* — DORITY & MANNING, P.A.

(57) ABSTRACT

Systems and methods for resetting a qubit are provided. In some example, a reset circuit can include a resonator structure. The resonator structure can include a superconducting material characterized by a superconducting energy gap. The reset circuit can include a frequency tuner configured to cause the resonator structure to resonate at a first frequency when the frequency tuner is in a first configuration, and at a second frequency when the frequency tuner is in a second configuration. An energy corresponding to the first frequency can be below the superconducting energy gap. An energy corresponding to the second frequency can be above the superconducting energy gap.

17 Claims, 7 Drawing Sheets

<u>500</u>

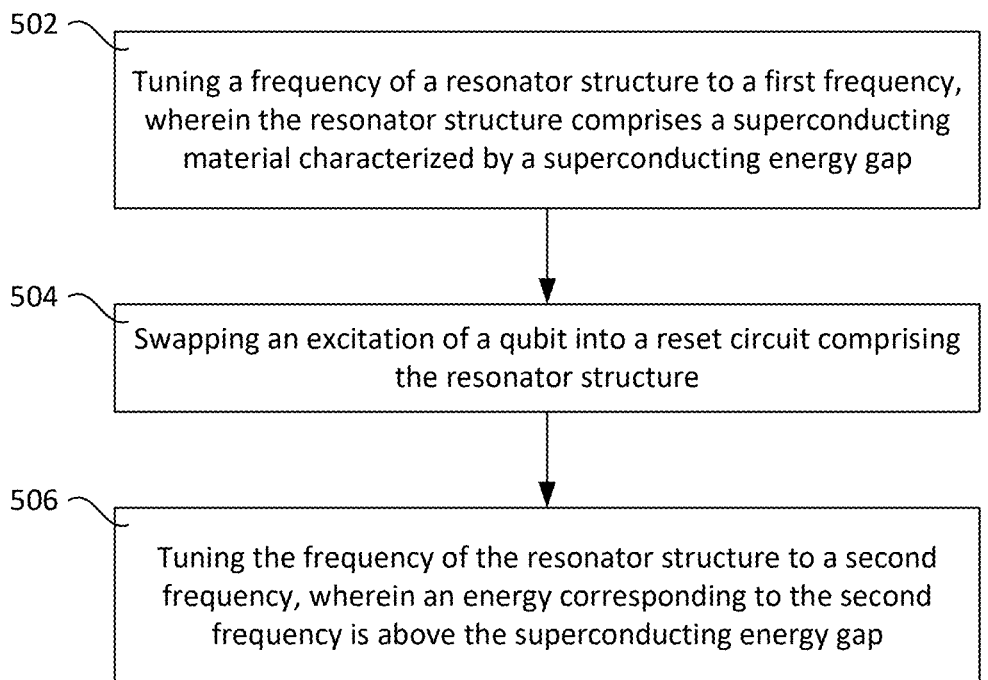

502 — Tuning a frequency of a resonator structure to a first frequency, wherein the resonator structure comprises a superconducting material characterized by a superconducting energy gap 504 — Swapping an excitation of a qubit into a reset circuit comprising the resonator structure 506 — Tuning the frequency of the resonator structure to a second frequency, wherein an energy corresponding to the second frequency is above the superconducting energy gap

*FIG. 5*

QUBIT RESET USING TUNABLE RESONATOR WITH FREQUENCY DEPENDENT LOSS

FIELD

The present disclosure relates generally to systems and methods for quantum computing.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$ The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

Example aspects of the present disclosure provide an example reset circuit. In some implementations, the example reset circuit can include a resonator structure. In the example reset circuit, the resonator structure can include a superconducting material characterized by a superconducting energy gap. The reset circuit can include a frequency tuner. In the example reset circuit, the frequency tuner can be configured to cause the resonator structure to resonate at a first frequency when the frequency tuner is in a first configuration, and at a second frequency when the frequency tuner is in a second configuration. In the example reset circuit, an energy corresponding to the first frequency can be below the superconducting energy gap. In the example reset circuit, an energy corresponding to the second frequency can be above the superconducting energy gap.

Example aspects of the present disclosure provide an example method. In some implementations, the example method can include swapping an excitation of a qubit into a reset circuit. In the example method, the reset circuit can include a resonator structure. In the example method, the resonator structure can include a superconducting material having a superconducting energy gap, wherein an energy corresponding to a first frequency is below the superconducting energy gap, and an energy corresponding to a second frequency is above the superconducting energy gap. In the example method, the reset circuit can include a frequency tuner. The example method can include tuning, using the frequency tuner, a resonant frequency of the resonator structure to the second frequency.

Example aspects of the present disclosure provide an example quantum computing system. In some implementations, the example quantum computing system can include a plurality of qubits. The example quantum computing can include a quantum logic circuit configured to perform one or more quantum operations on the plurality of qubits. The example quantum computing system can include an example reset circuit. In the quantum computing system, the reset circuit can include a resonator structure. In the quantum computing system, the resonator structure can include a superconducting material having a superconducting energy gap, wherein an energy corresponding to a first frequency is below the superconducting energy gap, and an energy corresponding to a second frequency is above the superconducting energy gap. In the quantum computing system, the example reset circuit can include a frequency tuner configured to cause the resonator structure to resonate at the first frequency when the frequency tuner is in a first configuration, and at the second frequency when the frequency tuner is in a second configuration.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which:

FIG. 5 depicts a flowchart diagram of an example method for resetting a qubit according to example aspects of the present disclosure;

DETAILED DESCRIPTION

Figure 1:
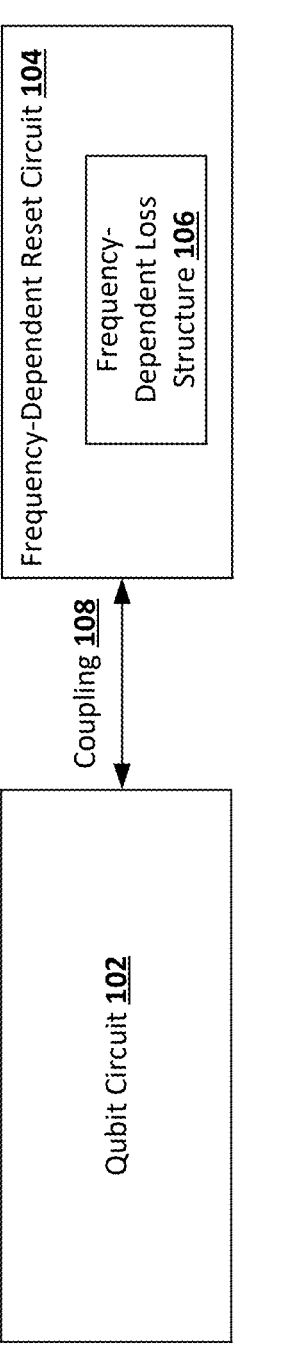
FIG. 1 depicts a block diagram of an example system for resetting a qubit according to example aspects of the present disclosure.

Example embodiments according to some aspects of the present disclosure are directed to systems and methods for providing qubit reset in a quantum computing system. Qubit reset can include, for example, setting a state of the qubit to a known state, such as a known basis state (e.g., $|0\rangle$ , etc.).

More particularly, example embodiments according to some aspects of the present disclosure are directed to systems and methods for providing qubit reset based on frequency-dependent loss structures. For example, a frequency-dependent loss structure can include a superconducting material having low loss at a first frequency (e.g., below a superconducting gap frequency) and high loss at a second frequency (e.g., above a superconducting gap frequency). In some instances, a lossy mode or dissipative mode can be "turned on" or "off" by controlling a frequency associated with the frequency-dependent loss structure. Resetting a qubit can include, for example, transferring an excitation from the qubit to a frequency-dependent loss structure (e.g., at a low-loss frequency); and dissipating the excitation by controlling a frequency associated with the frequency-dependent loss structure.

In some instances, a frequency-dependent loss structure can comprise a superconducting material having strong frequency-dependent loss. For example, the superconducting material can be characterized by a superconducting gap frequency, wherein the material has high loss at frequencies above the superconducting gap frequency and low loss at frequencies below the superconducting gap frequency. In some instances, the superconducting material can include a multilayer material, such as a bilayer comprising a superconducting and non-superconducting material; a bilayer comprising superconducting materials having different superconducting transition temperatures (i.e., different critical temperatures); or other superconducting multilayer.

An example reset circuit comprising a frequency-dependent loss structure can include a tunable resonator circuit having a tunable resonant frequency. For example, a tunable resonator circuit can include a tunable inductor-capacitor (LC) circuit comprising an inductor, a capacitor, and a frequency tuner. In some instances, the frequency tuner can include a superconducting quantum interference device (SQUID). In some instances, an example reset circuit can include a flux bias circuit, and a resonant frequency of the tunable resonator circuit can be controlled by applying a flux bias to the frequency tuner (e.g., SQUID).

In some instances, an inductance component of the tunable resonator circuit can comprise a frequency-dependent loss material (e.g., superconducting material as described above). For example, the frequency-dependent loss material can comprise a substantial portion (e.g., about 50 percent, etc.) of a total inductance of the tunable resonator circuit. Other components of a tunable resonator circuit (e.g., SQUID, capacitance, or any component other than the inductance) can comprise, for example, low-loss superconducting materials. For example, the other components can include materials having low loss at a frequency where the frequency-dependent loss material has high loss (e.g., superconducting materials with higher critical temperatures, larger superconducting energy gaps, etc., compared to the frequency-dependent loss material).

In some instances, the frequency-dependent loss resource can have a superconducting gap frequency (e.g., about 10 GHz, etc.) that overlaps with a tuning range of the tunable resonator circuit (e.g., about 3-15 GHz, etc.). In this manner, for instance, a lossy mode of the frequency-dependent loss structure can be "turned on" or "off" at will. For example, strong loss can be provided during a scheduled reset operation, and the loss can be well isolated from the qubits when a reset is not scheduled.

Example embodiments according to some aspects of the present disclosure provide quantum computing systems. An example quantum computing system can comprise one or more qubits; one or more control circuits for controlling the qubits; and one or more frequency-dependent reset circuits as described herein. The qubits can include, for example, any superconducting qubit, such as frequency-tunable or fixed-frequency qubits; any transmon, flux, gmon, fluxonium, zero-pi, or other superconducting qubit circuit; etc.

Example embodiments according to some aspects of the present disclosure provide methods for resetting a qubit. Resetting a qubit can include, for example, coupling the qubit to the reset circuit to transfer an excitation from the qubit to the reset circuit; and tuning a frequency of the reset circuit to a high-loss frequency to dissipate the excitation. In some instances, coupling the qubit to the reset circuit can include tuning the frequency of the reset circuit to match a frequency of the qubit. In some instances, a frequency of the qubit can be a low-loss frequency that is below a superconducting gap of a frequency-dependent loss material of the reset circuit.

An example field of application of the present disclosure can include quantum error correction (e.g., quantum surface codes, etc.). For example, some quantum error correction methods (e.g., surface codes, etc.) may include performing a plurality of error correction cycles, wherein a subset of the qubits of a quantum computing system can be read out and then reset at each error correction cycle. In some instances, while a reset operation of a quantum error correction method is being completed, data qubits of the quantum computing system can be idle, and can decohere if too much time passes during the reset cycle. Additionally, performing reset can include subjecting an excitation of the qubit to a loss resource (e.g., lossy circuit, etc.). In some instances, it can be desirable to isolate a loss resource from the qubits any time a reset is not being performed (e.g., to reduce qubit decoherence). Advantageously, example embodiments according to some aspects of the present disclosure can provide loss resources that can be "turned on" and "off" on demand, thereby providing fast reset that can be well isolated from qubits when a reset is not being performed.

Example embodiments according to some aspects of the present disclosure can provide for a number of technical effects and benefits, such as improvements to computing technology (e.g., quantum computing technology). For example, example embodiments according to some aspects of the present disclosure can provide improved isolation between a qubit and a source of loss; faster qubit reset; reduced qubit decoherence; smaller device footprints for quantum computing systems and components; and greater scalability of quantum computing systems.

For example, example embodiments according to some aspects of the present disclosure can provide a frequency-dependent loss that can be "turned on" and "off" by adjusting a frequency of a reset resonator. In this manner, for instance, example embodiments can provide a reset resonator configured to have low loss when it is coupled to the qubit, thereby isolating the qubit from the loss and avoiding qubit decoherence. Additionally, in some quantum computing systems, data qubits can remain idle while a reset operation is being performed and can therefore decohere during a reset operation. Thus, faster qubit reset can reduce such decoherence by reducing a time that the qubits are idle during the reset operation. In example simulations according to some aspects of the present disclosure, qubit reset was accomplished within less than 100 nanoseconds (ns), which can be faster than some alternative reset circuits. In this manner, for instance, an amount of qubit decoherence of a quantum computing system can be reduced.

As another example, example embodiments according to some aspects of the present disclosure can provide more compact (e.g., physically smaller, etc.) reset circuits compared to alternative implementations. For example, some alternative reset circuits may comprise a first circuit (e.g., low-loss circuit) for swapping an excitation from a qubit to the first circuit, and a second circuit (e.g., high-loss circuit) for dissipating the excitation. In contrast, reset circuits of the present disclosure can provide a single, compact circuit configured to provide low loss at some frequencies (e.g., frequencies at which a qubit excitation can be swapped into the reset circuit) and high loss at other frequencies, thereby reducing an amount of hardware (e.g., number of components; physical size of a reset circuit; etc.) required to reset a qubit compared to some alternative implementations. Additionally, in some instances, more compact hardware can provide better scalability of a quantum computing system by fitting more circuits (e.g., more reset circuits, more corresponding qubit circuits, etc.) into a smaller space, and may provide additional benefits as well (e.g., reduced thermalization cost for a cryogenic quantum computing system, etc.).

As used herein, the terms "about" or "approximately" in conjunction with a numerical value refer to within 10% of the stated amount.

With reference now to the Figures, example embodiments of the present disclosure will be discussed in further detail.

FIG. 1 depicts a block diagram of an example system for providing qubit reset for one or more qubits. A qubit circuit 102 can be operatively connected to a frequency-dependent reset circuit 104 via a coupling 108. The frequency-dependent reset circuit can comprise, for example, a frequency-dependent loss structure 106 configured to have low loss (e.g., low impedance, low or zero resistance, high quality factor, etc.) at a first frequency (e.g., below a superconducting gap frequency, etc.) and a higher loss at a second frequency (e.g., above a superconducting gap frequency, etc.). An excitation can be transferred from the qubit circuit 102 to the frequency-dependent reset circuit 104 at the first frequency (e.g., a low-loss frequency). After transfer, the excitation can be dissipated by causing the frequency-dependent reset circuit 104 or frequency-dependent loss structure 106 to resonate at the second frequency.

A qubit circuit 102 can include, for example, any circuit configured to exhibit quantum effects (e.g., entanglement, etc.) or maintain a quantum state (e.g., superposition of basis states, etc.). In some instances, a qubit circuit 102 can include a superconducting qubit circuit. For example, in some instances, a superconducting qubit circuit can comprise one or more Josephson junctions. A qubit circuit 102 can include, for example, a frequency-tunable or fixed-frequency qubit circuit. For example, in some instances, a frequency-tunable qubit circuit 102 can include a superconducting quantum interference device (SQUID) configured to modify a resonant frequency of the qubit circuit 102 when a flux bias is applied to the SQUID. In some instances, a qubit circuit 102 can include a tunable transmon qubit or components thereof, such as a capacitor connected in parallel with a SQUID comprising two Josephson junctions in parallel. In some instances, a qubit circuit 102 can include other qubit circuit types, such as any transmon, flux, gmon, fluxonium, zero-pi, other superconducting qubit circuit, etc.

A frequency-dependent reset circuit 104 can include, for example, any circuit configured to reset a quantum state to a known quantum state (e.g., by dissipating an excitation, etc.) at one or more first frequencies (e.g., all frequencies above a superconducting gap of a frequency-dependent loss structure 106, etc.), without causing reset (e.g., without dissipating a significant amount of energy, etc.) at one or more second frequencies (e.g., all frequencies below a superconducting gap of a frequency-dependent loss structure 106, etc.) In some instances, a frequency-dependent reset circuit 104 can comprise a frequency-dependent loss structure 106 for providing frequency-dependent loss. In some instances, the frequency-dependent loss circuit 104 can be configured so that a frequency (e.g., resonant frequency, etc.) associated with the frequency-dependent loss circuit 104 can be controllable. A circuit for controlling a frequency of the frequency-dependent reset circuit 104 can include, for example, one or more components of the frequency-dependent reset circuit 104; one or more components outside the frequency-dependent reset circuit 104; or both. Controlling a frequency associated with the frequency-dependent reset circuit can include a variety of frequency control methods, such as parametric control methods (e.g., parametric coupling, etc.), tuning methods, etc. Additional details of an example frequency-dependent reset circuit 104 according to some aspects of the present disclosure are further provided below with respect to FIGS. 2-3.

A frequency-dependent loss structure 106 can include any structure (e.g., circuit, circuit component, material, etc.) configured to have low loss at one or more first frequencies (e.g., first range of frequencies, etc.), and high loss at one or more second frequencies (e.g., second range of frequencies, etc.). Loss can include, for example, any form of energy loss (e.g., electrical energy loss) such as energy loss due to resistance, impedance, inductance, dielectric loss, etc. In some instances, a frequency-dependent loss structure 106 can include one or more materials having low loss at a first range of frequencies and high loss at a second range of frequencies. In some instances, a frequency-dependent loss structure can include one or more materials characterized by a sharp increase in loss at a particular frequency. For example, a frequency-dependent loss structure can include a superconducting material characterized by a superconducting energy gap when a temperature of the superconducting material is below a critical temperature (e.g., a temperature at which a resistance of the superconducting material drops to zero, etc.). In some instances, an energy gap can comprise an energy range at which no electron states exist. For example, a superconducting energy gap can correspond to an amount of energy gain for two electrons upon formation of a Cooper pair. In some instances, an amount of energy gain for two electrons upon formation of a Cooper pair can be expressed as $E_{gap} \approx 3.528 \, k_B T_C$ where $k_B$ can be Boltzmann's constant and $T_C$ can be a critical temperature. In some instances, an energy associated with a superconducting energy gap can correspond to a frequency associated with the superconducting energy gap according to the equation $E_{gap} = hf$, wherein $E_{gap}$ is the energy associated with the superconducting energy gap; f is the corresponding frequency; and h is Planck's constant. In some instances, the superconducting material can be characterized by low loss (e.g., zero resistance, low impedance, high quality factor, etc.) at frequencies below the gap frequency (e.g., frequencies corresponding to energies below the superconducting gap energy) and high loss (e.g., non-zero resistance, higher impedance, lower quality factor, etc.) at frequencies above the gap frequency (e.g., frequencies corresponding to energies above the superconducting gap energy).

In some instances, a frequency-dependent loss structure 106 can include a multilayer material (e.g., bilayer, multilayer superconducting material, etc.). In some instances, a frequency-dependent loss structure 106 can include a bilayer comprising a superconducting material and a non-superconducting material. In some instances, a frequency-dependent loss structure 106 can include a multilayer comprising two or more (e.g., two) superconducting materials, such as a first superconducting material having a first critical temperature and a second superconducting material having a second, lower critical temperature. Example multilayer materials for a frequency-dependent loss structure 106 can include iridium/aluminum bilayers, copper/aluminum bilayers, titanium/gold bilayers, molybdenum/copper bilayers, titanium/ silver bilayers, ruthenium/gold bilayers, titanium/platinum bilayers, etc. In some instances, example materials for a frequency-dependent loss structure 106 can include materials having a superconductor to lossy insulator transition, such as materials comprising niobium and silicon (e.g., having a ratio between about 16/84 and about 20/80 by mole, etc.). In some instances, example materials for a frequency-dependent loss structure 106 can include single-material superconducting materials, such as superconducting materials having a relatively low critical temperature (e.g., hafnium, etc.) and/or having a gap frequency at a relatively low frequency compared to other superconducting materials (e.g., superconducting materials of the qubit circuit 102; high-quality-factor superconducting materials such as pure aluminum, tantalum, or niobium; etc.). In some instances, a multilayer material can include a thin film multilayer comprising a plurality of thin-film layers. In some instances, each thin-film layer of a multilayer can comprise a single material (e.g., copper, aluminum, iridium, titanium, gold, silver, platinum, etc.). In some instances, a thin-film layer can include a monolayer (e.g., one-atom-thick layer, one-molecule-thick layer, etc.). In some instances, a thin-film layer can have a thickness less than 5 micrometers; such as less than 1 micrometer; such as less than 100 nanometers; such as less than 10 nanometers; such as less than 1 nanometer.

In some instances, a frequency-dependent loss structure 106 can include a material having a gap frequency that overlaps a frequency range associated with the frequency-dependent reset circuit 104 or a frequency range associated with the qubit circuit 102. For example, in some instances, a frequency-dependent loss structure 106 can comprise a material having a gap frequency between about 1 GHz and about 30 GHz; between about 3 GHz and about 15 GHz; between about 5 GHz and about 12 GHz; between about 6 GHz and about 10 GHz; between about 7 GHz and about 8 GHz; etc. In some instances, superconducting material can be characterized by a critical temperature, and a corresponding gap frequency can be related to the critical temperature according to the equations $E_{gap} \approx 3.528\,k_B T_C$ and $E_{gap} = hf_{gap}$, where $k_B$ can be Boltzmann's constant, h can be Planck's constant, $T_C$ can be a critical temperature, $E_{gap}$ can be a gap energy, and $f_{gap}$ can be a gap frequency. In some instances, this pair of equations can simplify to $f_{gap} \approx T_C * 73.5$ GHz/Kelvin. In some instances, a frequency-dependent loss structure 106 can comprise a material (e.g., superconductor/normal bilayer, etc.) having a critical temperature less than or equal to about 1 Kelvin; such as between about 20 milli-Kelvin and about 0.5 Kelvin; such as between about 40 milli-Kelvin and about 250 milli-Kelvin; such as equal to about 100 milli-Kelvin, which can correspond to a gap frequency at about 7.35 GHz. Other critical temperatures and gap frequencies are possible.

In some instances, a gap frequency can include a frequency between a first frequency and a second frequency, wherein a material (e.g., superconducting material) has a resistance of zero at the first frequency and a resistance greater than zero at the second frequency. In some instances, a gap frequency can include a frequency between a first frequency and a second frequency, wherein a material is characterized by a first electrical property at the first frequency and a second electrical property at the second frequency. The first and second electrical properties can include, for example, impedances, wherein the first impedance is lower than the second impedance; quality factors (e.g., surface impedance quality factors, etc.), wherein the first quality factor is higher than the second quality factor;

resistances; inductances; or other properties indicative of a rate of energy loss. For example, a first electrical property can be a quality factor greater than or equal to $10^2$; such as greater than or equal to about $10^3$; such as greater than or equal to about $10^4$; such as greater than or equal to about $10^5$; etc. In some instances, a second electrical property can be a quality factor less than a quality factor of the first electrical property, such as less than or equal to about $10^3$; such as less than or equal to about $10^2$; such as less than or equal to about 10; such as less than or equal to about 1; such as less than or equal to about 0.1; etc. In some instances, a first electrical property can be a quality factor that is greater than or equal to ten times higher than the second electrical property; such as greater than or equal to 100 times higher than the second electrical property; such as greater than or equal to 1000 times higher than the second electrical property; such as greater than or equal to 2000 times higher than the second electrical property; such as greater than or equal to 5000 times higher than the second electrical property; such as greater than or equal to 10,000 times higher than the second electrical property; etc.

Additional details of example frequency-dependent loss structures 106 according to some aspects of the present disclosure are further provided below with respect to FIGS. 2-3.

A coupling 108 can include any circuit, component, or other structure for coupling a qubit circuit 102 to a frequency-dependent reset circuit 104. Coupling a qubit circuit 102 to a frequency-dependent reset circuit 104 can include any type of coupling, such as capacitive coupling, parametric coupling, resonance coupling, etc. In some instances, the coupling 108 can be configured to be turned "on" and "off", such that the qubit circuit 102 can be electrically coupled to the frequency-dependent reset circuit 104 under some circumstances, and can be decoupled from the frequency-dependent reset circuit 104 under other circumstances. In some instances, the circumstances may be controllable via one or more control structures (e.g., control devices 612 as described below with respect to FIG. 6, etc.). For example, a coupling 108 may be configured to depend on a relationship between a first frequency (e.g., resonant frequency, etc.) associated with the qubit circuit 102 and a second frequency associated with the frequency-dependent reset circuit 104. For example, a coupling 108 may be configured such that the qubit circuit 102 and frequency-dependent reset circuit 104 are coupled when the first frequency is approximately equal to an integer multiple (e.g., one) times the second frequency and decoupled otherwise. In such instances, the system of FIG. 1 can include one or more frequency control devices (e.g., as part of the qubit circuit 102; frequency-dependent reset circuit 104; coupling 108; or other quantum computing system component).

Figure 2:
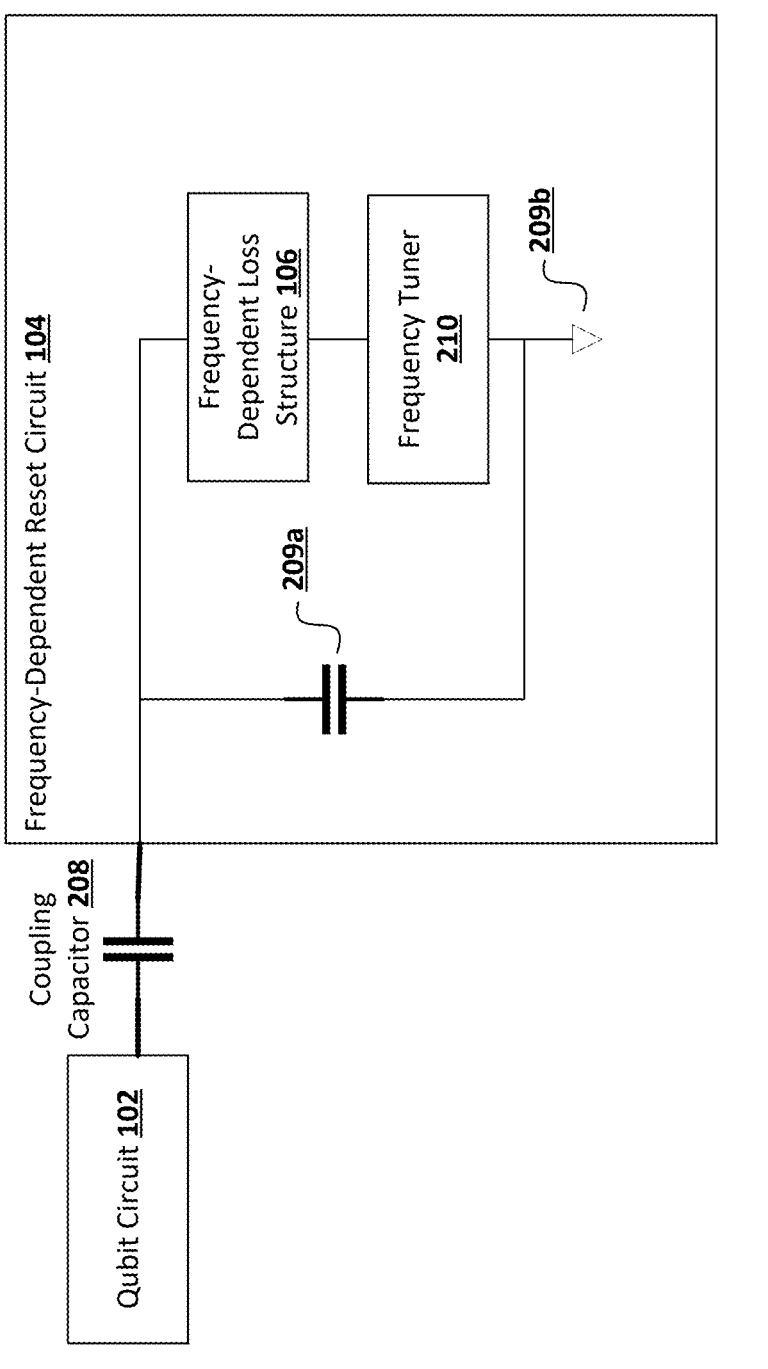
FIG. 2 depicts a block diagram of an example system for resetting a qubit according to example aspects of the present disclosure.

FIG. 2 depicts a block diagram of an example system for providing qubit reset for one or more qubits using a frequency tuner 210 according to some aspects of the present disclosure. A qubit circuit 102 can be coupled to a frequency-dependent reset circuit 104 via a coupling capacitor 208. The frequency-dependent reset circuit 104 can include a frequency tuner 210 for tuning a resonant frequency of the frequency-dependent reset circuit 104; a frequency-dependent loss structure 106; and one or more additional components 209a-b (e.g., shunt capacitor 209a, ground connection structure 209b, etc.).

A coupling capacitor 208 can include, for example, a capacitor configured to couple the qubit circuit 102 to the frequency-dependent reset circuit 104. In some instances, a coupling capacitor 208 can be, comprise, or be comprised by a coupling 108.

Additional components 209 can include, for example, any circuit component (e.g., component of a cryogenic superconducting circuit, etc.) that is not a frequency-dependent loss structure 106 or frequency tuner 210. In some instances, additional components 209 can include a capacitor 209a (e.g., connected in parallel with the frequency-dependent loss structure 106 and frequency tuner 210). In some instances, additional components can include a ground connection structure 209b. In some instances, the additional components 209 can comprise high-quality-factor materials (e.g., low-loss materials, etc.). For example, the additional components 209 can include one or more materials having low loss (e.g., high quality factor, etc.) throughout a frequency tuning range of the qubit circuit 102; a frequency tuning range of a frequency tuner 210; above and below a gap frequency of a frequency-dependent loss structure 106; etc. Example materials can include aluminum, tantalum, niobium, and the like.

A frequency tuner 210 can include, for example, any component configured to control a frequency (e.g., resonant frequency, etc.) associated with the frequency-dependent reset circuit 104. In some instances, the frequency tuner 210 can comprise one or more high-quality-factor materials (e.g., low-loss materials, etc.). For example, the frequency tuner 210 can include one or more materials having low loss (e.g., high quality factor, etc.) throughout a frequency tuning range of the qubit circuit 102; a frequency tuning range of a frequency tuner 210; above and below a gap frequency of a frequency-dependent loss structure 106; etc. Example materials can include aluminum, tantalum, niobium, and the like. Additional details of an example frequency tuner 210 are further provided below with respect to FIG. 3.

Figure 3:
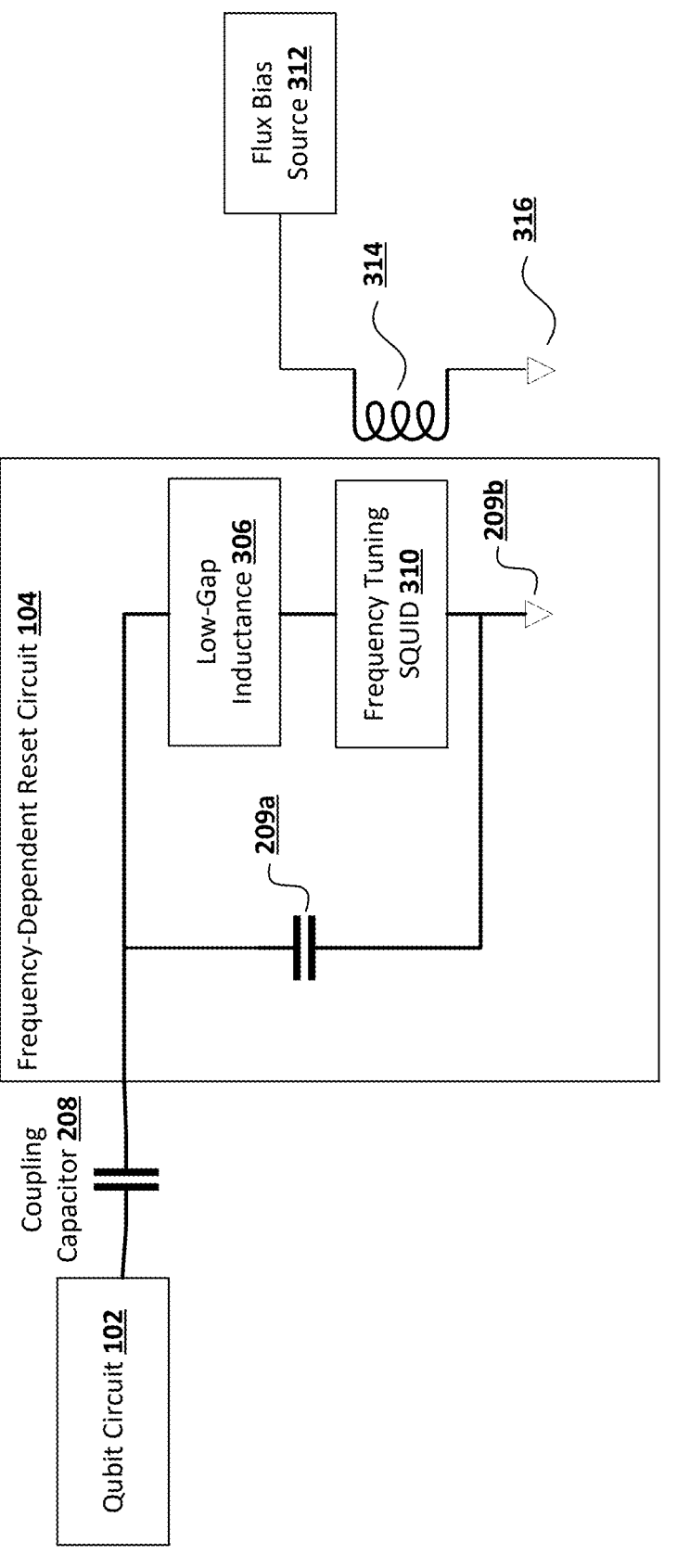
FIG. 3 depicts a block diagram of an example system for resetting a qubit according to example aspects of the present disclosure.

FIG. 3 depicts a block diagram of an example system for providing qubit reset for one or more qubits according to some aspects of the present disclosure. A qubit circuit 102 can be coupled to a frequency-dependent reset circuit 104 via a coupling capacitor 208. The frequency-dependent reset circuit 104 can comprise a low-gap inductance 306 acting as a frequency-dependent loss structure 106, a frequency tuning SQUID 310 for tuning a frequency of the frequency-dependent reset circuit 104, and one or more additional circuit components 209. A flux bias can be applied to the frequency tuning SQUID 310 via a flux bias circuit coupled (e.g., inductively coupled) to the frequency tuning SQUID 310. The flux bias circuit can include, for example, a flux bias source 312, inductor 314, and ground connection structure 316.

A low-gap inductance 306 can be, comprise, be comprised by, or otherwise share one or more properties with a frequency-dependent loss structure 106. In some instances, a low-gap inductance 306 can include an inductance structure made from one or more materials having a frequency-dependent loss, such as one or more materials described above with respect to FIG. 1 and the frequency-dependent loss structure 106. In some instances, the low-gap inductance 306 can include a narrow wire (e.g., long, narrow wire). In some instances, the low-gap inductance 306 can be meandered (e.g., to achieve higher total inductance compared to a straight component). In some instances, the low-gap inductance 306 can comprise an appreciable fraction (e.g., between about 20 and 80 percent; e.g., between about 30 and 70 percent; e.g., between about 40 and 60 65 percent; e.g., about 50 percent) of the total inductance of the frequency-dependent reset circuit 104. In some instances, a gap frequency of the one or more materials can overlap a tuning range of the frequency-dependent reset circuit 104, frequency tuner 210, or frequency tuning SQUID 310. As an illustrative example, a frequency-dependent reset circuit 104 can be configured to be tunable from about 3 GHz to about 15 GHz, and a gap frequency can be about 10 GHz. Other frequencies are possible. For example, a gap frequency can include any gap frequency described above with respect to FIG. 1 and the frequency-dependent loss structure 106. A frequency-dependent reset circuit 104 can be configured to be tunable from a first frequency below the gap frequency (e.g., less than or equal to about: 10, 20, 30, 40, 50, 60, 70, etc. percent below the gap frequency) and a second frequency above the gap frequency (e.g., greater than or equal to about: 10, 20, 30, 40, 50, 60, 70, 100, 200, etc. percent above the gap frequency).

The frequency tuning SQUID 310 can be, comprise, be comprised by, or otherwise share one or more properties with a frequency tuner 210. The frequency tuning SQUID 310 include, for example, a superconducting quantum interference device (SQUID). In some instances, a SQUID can comprise two Josephson junctions connected in parallel. In some instances, a frequency tuning SQUID 310 can be configured to act as a tunable inductance element.

The flux bias source 312 can include any circuit, component, device, or other structure for providing a bias pulse (e.g., flux pulse, etc.). For example, a flux bias source 312 can include an on-chip bias line; a flux pump device; a single flux quantum (SFQ) device; a digital-to-analog converter (DAC) device (e.g., SFQ flux DAC, etc.); or the like. In general, the flux bias source 312, inductor 314, and ground connection structure can include any flux circuit (e.g., DC flux bias generator), inductor, or ground connection components (e.g., standard components, special-purpose components, etc.) configured to be used in a quantum computing system (e.g., cryogenic superconducting quantum computing system, etc.).

Example Methods

Figure 4A:
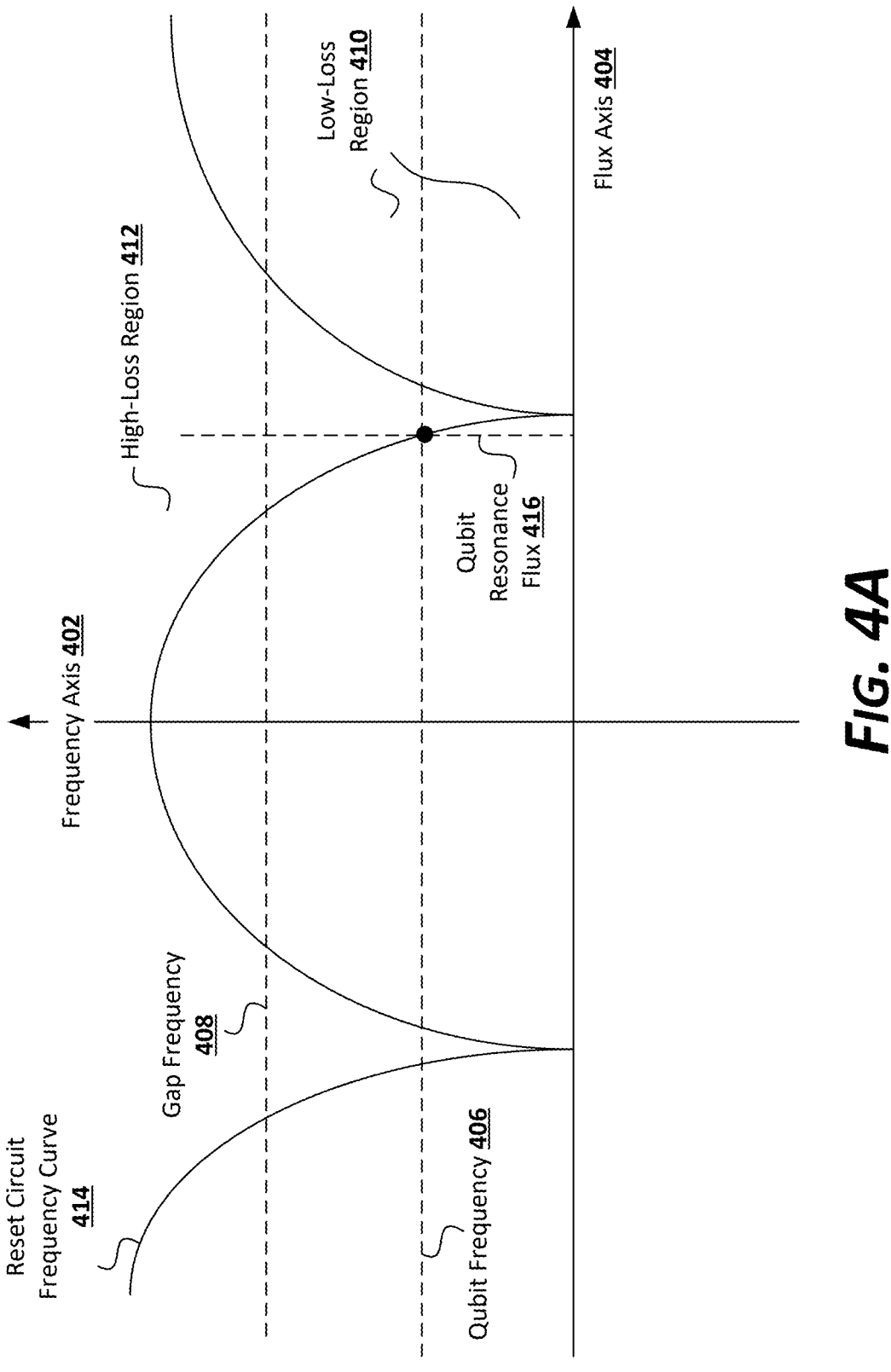
FIG. 4A illustrates a first view of an example method for resetting a qubit according to example aspects of the present disclosure.
Figure 4B:
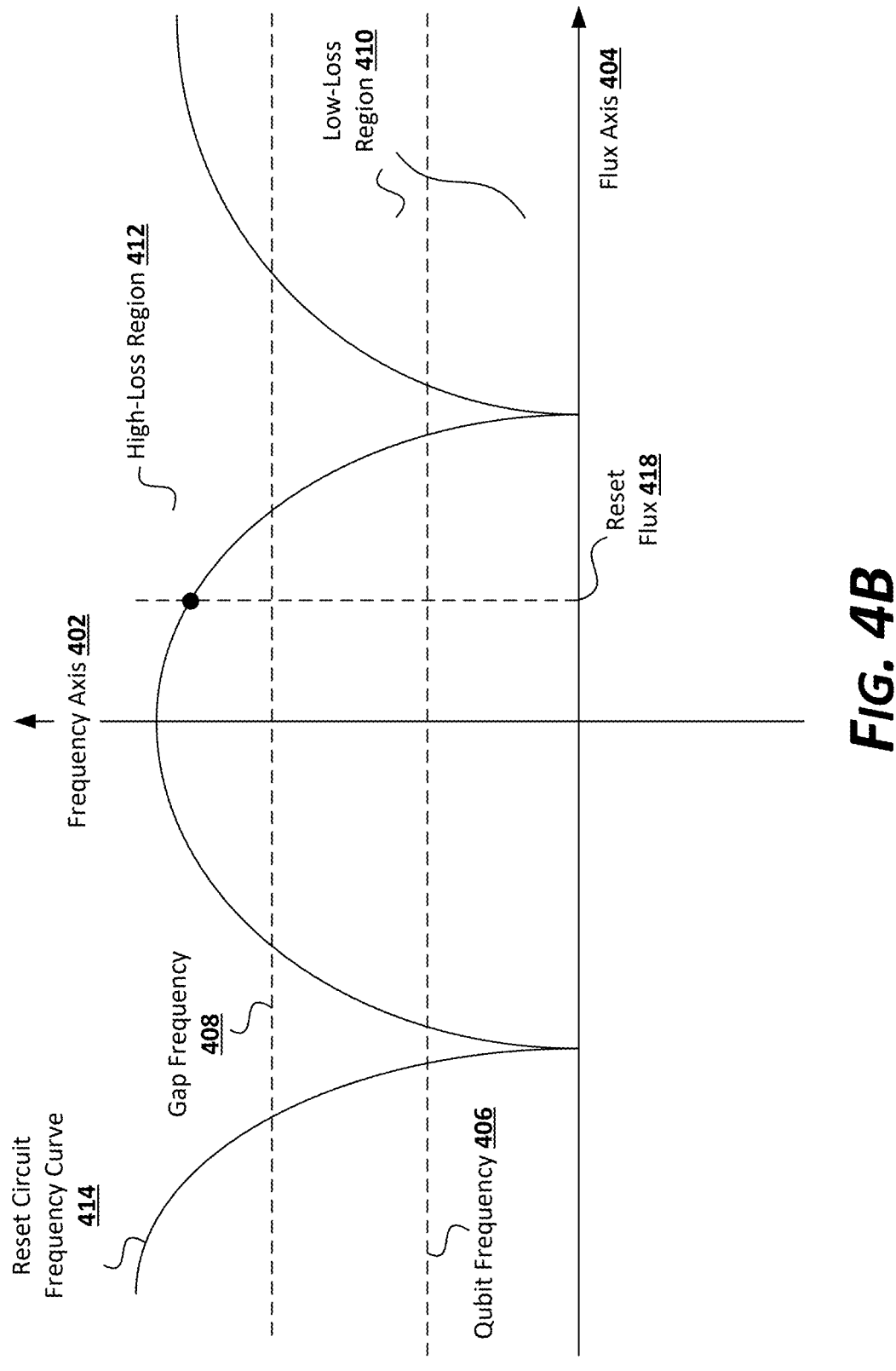
FIG. 4B illustrates a second view of an example method for resetting a qubit according to example aspects of the present disclosure.

FIGS. 4A-B illustrate an example method for resetting a qubit according to some aspects of the present disclosure. At FIG. 4A, an excitation can be transferred from the qubit to the frequency-dependent reset circuit 104 by tuning a frequency of the frequency-dependent reset circuit 104 to be on resonance with the qubit circuit 102. At FIG. 4B, the excitation can be dissipated by tuning a frequency of the frequency-dependent reset circuit 104 to a frequency above a gap frequency 408, where the frequency-dependent reset circuit 104 will have high loss.

FIG. 4A illustrates a configuration of the frequency-dependent reset circuit 104 in which an excitation can be transferred from the qubit circuit 102 to the frequency-dependent reset circuit 104. More particularly, FIG. 4A depicts a reset circuit frequency curve 414 plotted on a frequency axis 402 (dependent variable) and a flux axis 404 (independent variable), showing a relationship between a flux applied to a frequency tuner 210 (e.g., frequency tuning SQUID 310) and a frequency (e.g., resonant frequency) associated with the frequency-dependent reset circuit 104. A flux equal to the qubit resonance flux 416 can be applied to cause a frequency of the frequency-dependent reset circuit 104 to be about equal to a qubit frequency 406 of the qubit circuit 102, causing an excitation to be swapped from the qubit circuit 102 to the frequency-dependent reset circuit 104.

The frequency axis 402 and flux axis 404 are axes of an example graph (plot, illustration, etc.) depicting the reset circuit frequency curve 414.

The qubit frequency 406 can be, for example, a frequency (e.g., resonant frequency, etc.) associated with a qubit circuit 102. In some instances, a qubit circuit 102 can be a fixed-frequency circuit, and the qubit frequency 406 can have a fixed value. In some instances, a qubit circuit 102 can include a frequency-tunable qubit, and the qubit frequency 406 can have a value that changes as the frequency of the qubit circuit 102 is tuned. In some instances, a qubit circuit 102 can be associated with a plurality of qubit frequencies 406. In some instances, a qubit frequency 406 can include a qubit |0⟩ to |1⟩ transition frequency (e.g., transition frequency from a ground state to a first excited state, etc.); a qubit |1⟩ to |2⟩ transition frequency (e.g., transition frequency from a first excited state to a second excited state, etc.); and so on. In some instances, swapping an excitation from the qubit circuit 102 to a frequency-dependent reset circuit 104 can include sweeping sequentially over a plurality of qubit frequencies 406. For example, a flux equal to a first qubit resonance flux 416 can be applied (e.g., qubit resonance flux 416 associated with a |3⟩ →|2⟩ transition frequency, etc.); then a flux equal to a second qubit resonance flux 416 can be applied (e.g., qubit resonance flux 416 associated with a |2⟩ →|1⟩ transition frequency, etc.); then a flux equal to a third qubit resonance flux 416 can be applied (e.g., qubit resonance flux 416 associated with a |1⟩ →|0⟩ transition frequency, etc.). In this manner, for instance, a qubit circuit 102 can be reset to a |0⟩ basis state from higher states (e.g., |2⟩, |3⟩, |4⟩, etc.) of the qubit circuit 102.

The gap frequency 408 can be, for example, a frequency between a first frequency and second frequency, wherein a frequency-dependent loss structure 106 has low loss at the first frequency and high loss at the second frequency. For example, the gap frequency 408 can have any property of a gap frequency as described above with respect to FIG. 1 and the frequency-dependent loss structure 106.

The low-loss region 410 and high-loss region 412 can be frequency regions below and above the gap frequency 408. For example, the low-loss region 410 and high-loss region 412 can include frequency regions associated with low loss and high loss, respectively, as described above with respect to FIG. 1 and the frequency-dependent loss structure 106.

In some instances, the qubit frequency 406 can be in a low-loss region 410 (e.g., below a gap frequency 408). For example, having a qubit frequency 406 below the gap frequency 408 can avoid decohering the qubit when swapping an excitation.

The reset frequency curve 414 is a curve showing an example relationship between a flux applied to a frequency tuner 210 (e.g., frequency tuning SQUID 310) and a frequency (e.g., resonant frequency) associated with the frequency-dependent reset circuit 104. The reset frequency curve 414 is not necessarily to scale, and the frequency-dependent reset circuit 104 is not necessarily required to exhibit a flux-frequency relationship similar to the relationship depicted in FIG. 4A-B. For example, any continuous flux-frequency curve that crosses the qubit frequency 406 can have a qubit resonance flux 416 at which the frequency of the frequency-dependent reset circuit 104 will be equal or about equal to a qubit frequency 406 of the qubit circuit 102.

The qubit resonance flux 416 can be, for example, a flux value such that, when a flux equal to the qubit resonance flux 416 is applied to a frequency tuner 210 (e.g., frequency tuning SQUID 310), the frequency-dependent reset circuit

104 will be on resonance with the qubit circuit 102. For example, when a flux equal to the qubit resonance flux 416 is applied to a frequency tuner 210, a frequency of the frequency-dependent reset circuit 104 can be equal or about equal to the qubit frequency 406.

FIG. 4B illustrates a configuration of the frequency-dependent reset circuit 104 in which an excitation transferred to the frequency-dependent reset circuit 104 can be dissipated. For example, a reset flux 418 can be applied to a frequency tuner 210 (e.g., frequency tuning SQUID 310) to cause a frequency of the frequency-dependent reset circuit to be in a high-loss region 412 (e.g., above a gap frequency 408). A reset flux 418 can include, for example, any flux value configured to cause the frequency to be in the high-loss region.

FIG. 5 depicts a flowchart diagram of an example method for resetting a qubit according to example embodiments of the present disclosure. Although FIG. 5 depicts steps performed in a particular order for purposes of illustration and discussion, the methods of the present disclosure are not limited to the particularly illustrated order or arrangement. The various steps of example method 500 can be omitted, rearranged, combined, and/or adapted in various ways without deviating from the scope of the present disclosure.

At 502, example method 500 can include tuning a frequency of a resonator structure (e.g., tunable resonator circuit such as tunable LC circuit; circuit comprising superconducting cavity resonator, waveguide resonator such as coplanar waveguide resonator, or transmission line resonator; etc.) to a first frequency, wherein the resonator structure comprises a superconducting material characterized by a superconducting energy gap. In some instances, a resonator structure can comprise a frequency-dependent loss structure 106. In some instances, the first frequency can be a qubit frequency 406. In some instances, the first frequency can be a frequency in a low-loss region 410 or otherwise associated with a low loss of a frequency-dependent loss structure 106. In some instances, example method 500 at 502 can include using one or more systems or performing one or more activities described with respect to FIGS. 1-4.

At 504, example method 500 can include swapping an excitation of a qubit (e.g., qubit circuit 102) into a reset circuit (e.g., frequency-dependent reset circuit 104) comprising the resonator structure. In some instances, swapping an excitation of a qubit can include a multi-level excitation swap. For example, as described above with respect to FIG. 4, swapping an excitation can include sweeping a frequency of a frequency-dependent reset circuit 104 past a first qubit transition frequency (e.g., |3⟩ →|2⟩ transition frequency, etc.); a second qubit transition frequency (e.g., |2⟩ →|1⟩ transition frequency, etc.); a third qubit transition frequency (e.g., |1⟩ →|0⟩ transition frequency, etc.); and so on, to facilitate reset from higher excited states of a qubit. In some instances, example method 500 at 504 can include using one or more systems or performing one or more activities described with respect to FIGS. 1-4.

At 506, example method 500 can include tuning the frequency of the resonator structure to a second frequency, wherein an energy corresponding to the second frequency is above the superconducting energy gap. For example, the second frequency can be a frequency in a high-loss region 412 above a gap frequency 408. In some instances, tuning a frequency can be performed using a frequency tuner 210 (e.g., frequency tuning SQUID 310). In some instances, tuning a frequency can include applying a flux bias to a frequency tuner 210 (e.g., using a flux bias source 312, etc.). In some instances, example method 500 at 506 can include using one or more systems or performing one or more activities described with respect to FIGS. 1-4.

Figure 6:
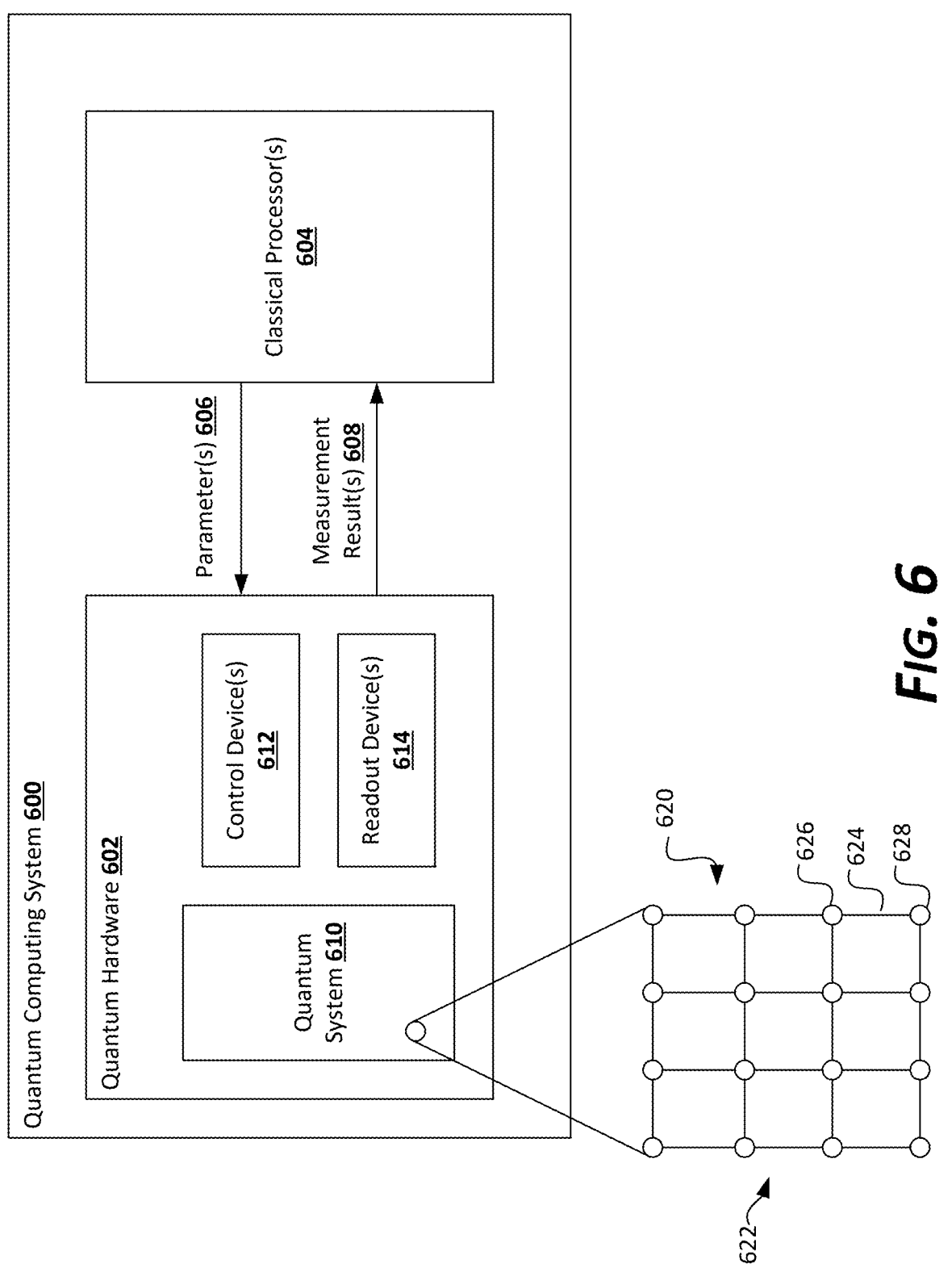
FIG. 6 depicts an example quantum computing system according to example aspects of the present disclosure.

FIG. 6 depicts an example quantum computing system 600. The example system 600 is an example of a system on one or more classical computers or quantum computing devices in one or more locations, in which the systems, components, and techniques described below can be implemented. Those of ordinary skill in the art, using the disclosures provided herein, will understand that other quantum computing structures or systems can be used without deviating from the scope of the present disclosure.

The system 600 includes quantum hardware 602 in data communication with one or more classical processors 604. The quantum hardware 602 includes components for performing quantum computation. For example, the quantum hardware 602 includes a quantum system 610, control device(s) 612, and readout device(s) 614 (e.g., readout resonator(s)). The quantum system 610 can include one or more multi-level quantum subsystems, such as a register of qubits. In some implementations, the multi-level quantum subsystems can include superconducting qubits, such as flux qubits, charge qubits, transmon qubits, gmon qubits, etc. In some implementations, the quantum hardware 602 (e.g., quantum system 610, control devices 612, etc.) can include one or more components depicted in FIGS. 1-3 (e.g., frequency-dependent reset circuit 104, qubit circuit 102, flux bias source 312, etc.).

The type of multi-level quantum subsystems that the system 600 utilizes may vary. For example, in some cases it may be convenient to include one or more readout device(s) 614 attached to one or more superconducting qubits, e.g., transmon, flux, gmon, xmon, or other qubits. In other cases, ion traps, photonic devices or superconducting cavities (e.g., with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 610 via multiple control lines that are coupled to one or more control devices 612. Example control devices 612 that operate on the register of qubits can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 612 may be configured to operate on the quantum system 610 through one or more respective control parameters (e.g., one or more physical control parameters). For example, in some implementations, the multi-level quantum subsystems may be superconducting qubits and the control devices 612 may be configured to provide control pulses to control lines to generate magnetic fields to adjust the frequency of the qubits.

The quantum hardware 602 may further include readout devices 614 (e.g., readout resonators). Measurement results 608 obtained via measurement devices may be provided to the classical processors 604 for processing and analyzing. In some implementations, the quantum hardware 602 may include a quantum circuit and the control device(s) 612 and readout devices(s) 614 may implement one or more quantum logic gates that operate on the quantum system 602 through physical control parameters (e.g., microwave pulses) that are sent through wires included in the quantum hardware 602. Further examples of control devices include arbitrary waveform generators, wherein a DAC (digital to analog converter) creates the signal.

The readout device(s) 614 may be configured to perform quantum measurements on the quantum system 610 and send measurement results 608 to the classical processors 604. In addition, the quantum hardware 602 may be configured to receive data specifying physical control qubit parameter values 606 from the classical processors 604. The quantum hardware 602 may use the received physical control qubit parameter values 606 to update the action of the control device(s) 612 and readout devices(s) 614 on the quantum system 610. For example, the quantum hardware 602 may receive data specifying new values representing voltage strengths of one or more DACs included in the control devices 612 and may update the action of the DACs on the quantum system 610 accordingly. The classical processors 604 may be configured to initialize the quantum system 610 in an initial quantum state, e.g., by sending data to the quantum hardware 602 specifying an initial set of parameters 606.

The readout device(s) 614 can take advantage of a difference in the impedance for the $|0\rangle$ and $|1\rangle$ states of an element of the quantum system, such as a qubit, to measure the state of the element (e.g., the qubit). For example, the resonance frequency of a readout resonator can take on different values when a qubit is in the state $|0\rangle$ or the state $|1\rangle$, due to the nonlinearity of the qubit. Therefore, a microwave pulse reflected from the readout device 614 carries an amplitude and phase shift that depend on the qubit state. In some implementations, a Purcell filter can be used in conjunction with the readout device(s) 614 to impede microwave propagation at the qubit frequency.

In some implementations, the quantum system 610 can include a plurality of qubits 620 arranged, for instance, in a two-dimensional grid 622. For clarity, the two-dimensional grid 622 depicted in FIG. 6 includes 16 qubits arranged in a square formation, however in some implementations the system 610 may include a smaller or a larger number of qubits. In some embodiments, the multiple qubits 620 can interact with each other through multiple qubit couplers, e.g., qubit coupler 624. The qubit couplers can define nearest neighbor interactions between the multiple qubits 620. In some implementations, the strengths of the multiple qubit couplers are tunable parameters. In some cases, the multiple qubit couplers included in the quantum computing system 600 may be couplers with a fixed coupling strength. In some implementations, the multiple qubits 620 may include data qubits, such as qubit 626 and measurement qubits, such as qubit 628. A data qubit is a qubit that participates in a computation being performed by the system 600. A measurement qubit is a qubit that may be used to determine an outcome of a computation performed by the data qubit. That is, during a computation an unknown state of the data qubit is transferred to the measurement qubit using a suitable physical operation and measured via a suitable measurement operation performed on the measurement qubit.

In some implementations, each qubit in the multiple qubits 620 can be operated using respective operating frequencies, such as an idling frequency and/or an interaction frequency and/or readout frequency and/or reset frequency. The operating frequencies can vary from qubit to qubit. For instance, each qubit may idle at a different operating frequency. The operating frequencies for the qubits 620 can be chosen before a computation is performed by the calibration system. Some operating frequencies are better than other operating frequencies. One metric for assessing how good a particular operating frequency is for a particular qubit is energy relaxation time (T1) for the qubit at the frequency. Lower energy relaxation times can lead to larger quantum computational errors.

In various implementations, the example system 600 can be implemented as a client device, a server device, or both. The example system 600 can be implemented as part of a distributed computing system. The example system 600 can be implemented along with other example systems, which may be the same or different. The example system 600 can be implemented in a server farm or other facility that operates multiple computing systems to provide computational services to or on behalf of a plurality of client systems. Advantageously, techniques according to example aspects of the present disclosure can provide for improved calibration and maintenance of computing facilities, increasing service uptime, decreasing failure rates, etc.

Implementations of the digital, classical, and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs (e.g., one or more modules of digital and/or quantum computer program instructions encoded on a tangible non-transitory storage medium for execution by, or to control the operation of, data processing apparatus). The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit (i.e., a system that defines the unit of quantum information). It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qubits) are possible. The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more tangible, non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

Aspects of the disclosure have been described in terms of illustrative implementations thereof. Numerous other implementations, modifications, or variations within the scope and spirit of the appended claims can occur to persons of ordinary skill in the art from a review of this disclosure. Any and all features in the following claims can be combined or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein, with "or" being understood as "and/or" unless otherwise indicated. Also, terms such as "based on" should be understood as "based at least in part on."

Those of ordinary skill in the art, using the disclosures provided herein, will understand that the elements of any of the claims, operations, or processes discussed herein can be adapted, rearranged, expanded, omitted, combined, or modified in various ways without deviating from the scope of the present disclosure. Some of the claims are described with a letter reference to a claim element for exemplary illustrated purposes and is not meant to be limiting. The letter references do not imply a particular order of operations. For instance, letter identifiers such as (a), (b), (c), . . . , (i), (ii), (iii), . . . , etc. can be used to illustrate operations. Such identifiers are provided for the ease of the reader and do not denote a particular order of steps or operations. An operation illustrated by a list identifier of (a), (i), etc. can be performed before, after, or in parallel with another operation illustrated by a list identifier of (b), (ii), etc.

What is claimed is:

1. A reset circuit comprising:
a resonator structure comprising a superconducting material characterized by a superconducting energy gap; and
a frequency tuner configured to cause the resonator structure to resonate at a first frequency when the frequency tuner is in a first configuration, and at a second frequency when the frequency tuner is in a second configuration;
wherein an energy corresponding to the first frequency is below the superconducting energy gap, and an energy corresponding to the second frequency is above the superconducting energy gap; and
wherein the frequency tuner comprises a superconducting quantum interference device (SQUID).

2. The reset circuit of claim 1, further comprising a second superconducting material characterized by a second superconducting energy gap, wherein the energy corresponding to the second frequency is below the second superconducting energy gap.

3. The reset circuit of claim 1, wherein the resonator structure comprises an inductance structure comprising the superconducting material.

4. The reset circuit of claim 3, wherein the superconducting material comprises more than 20 percent of a total inductance of the resonator structure.

5. The reset circuit of claim 1, further comprising a flux circuit configured to apply a flux bias to the frequency tuner.

6. The reset circuit of claim 1, wherein the superconducting material is a multilayer superconducting material comprising a first layer having a first material and a second layer having a second material, wherein the first material is a superconducting material.

7. The reset circuit of claim 6, wherein the second material is a superconducting material having a lower critical temperature than the first material.

8. The reset circuit of claim 6, wherein the second material is a non-superconducting material.

9. A method for resetting a qubit, comprising:
swapping an excitation of the qubit into a reset circuit, wherein the reset circuit comprises:
a resonator structure comprising a superconducting material having a superconducting energy gap, wherein an energy corresponding to a first frequency is below the superconducting energy gap, and an energy corresponding to a second frequency is above the superconducting energy gap; and
a frequency tuner; and
tuning, using the frequency tuner, a resonant frequency of the resonator structure to the second frequency, wherein tuning the resonant frequency comprises applying a flux bias to the frequency tuner.

10. The method of claim 9, wherein swapping the excitation comprises tuning, using the frequency tuner, the resonant frequency of the resonator structure to match a qubit frequency associated with the qubit.

11. The method of claim 10, wherein the qubit frequency is the first frequency.

12. The method of claim 9, wherein the frequency tuner comprises a SQUID.

13. The method of claim 9, wherein the resonator structure comprises an inductance structure comprising the superconducting material.

14. The method of claim 9, wherein the resonator structure further comprises a second superconducting material characterized by a second superconducting energy gap, wherein the energy corresponding to the second frequency is below the second superconducting energy gap.

15. A quantum computing system, comprising:
a plurality of qubits;
a quantum logic circuit configured to perform one or more quantum operations on the plurality of qubits; and
a reset circuit comprising:
a resonator structure comprising a superconducting material having a superconducting energy gap, wherein an energy corresponding to a first frequency is below the superconducting energy gap, and an energy corresponding to a second frequency is above the superconducting energy gap; and
a frequency tuner configured to cause the resonator structure to resonate at the first frequency when the frequency tuner is in a first configuration, and at the second frequency when the frequency tuner is in a second configuration;
wherein the resonator structure comprises an inductance structure comprising the superconducting material.

16. The quantum computing system of claim 15, wherein the superconducting material is a multilayer superconducting material comprising a first layer having a first material and a second layer having a second material, wherein the first material is a superconducting material.

17. The quantum computing system of claim 15, wherein the resonator structure further comprises a second superconducting material characterized by a second superconducting energy gap, wherein the energy corresponding to the second frequency is below the second superconducting energy gap.

* * * * *